(12) United States Patent
Shum et al.

(10) Patent No.: US 9,337,047 B2
(45) Date of Patent: May 10, 2016

(54) SEMICONDUCTOR DEVICE AND METHOD OF MAKING SEMICONDUCTOR DEVICE (75) Inventors: Danny Pak-Chum Shum, Poughkeepsie, NY (US); Ronald Kakoschke, Munich (DE); John Power, Dresden (DE); Wolfram Langheinrich, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 254 days.

(21) Appl. No.: 11/856,086

(22) Filed: Sep. 17, 2007

(65) Prior Publication Data

US 2009/0072292 A1 Mar. 19, 2009

(51) Int. Cl.
| | | |
|---|---|---|
| H01L 29/788 | (2006.01) | |
| H01L 21/4763 | (2006.01) | |
| H01L 21/28 | (2006.01) | |
| H01L 27/105 | (2006.01) | |
| H01L 27/115 | (2006.01) | |
| H01L 29/66 | (2006.01) | |
| H01L 29/78 | (2006.01) | |

(52) U.S. Cl.
CPC ........ *H01L 21/28273* (2013.01); *H01L 27/105* (2013.01); *H01L 27/11526* (2013.01); *H01L 29/66545* (2013.01); *H01L 29/6656* (2013.01); *H01L 29/6659* (2013.01); *H01L 29/7833* (2013.01)

(58) Field of Classification Search
USPC .............. 257/316, 315, 314, E29.3; 438/593
See application file for complete search history.

(56) References Cited

U.S. PATENT DOCUMENTS

| | | | | |
|---|---|---|---|---|
| 5,837,598 | A | 11/1998 | Aronowitz et al. | |
| 6,080,645 | A * | 6/2000 | Pan | 438/585 |
| 6,127,227 | A * | 10/2000 | Lin et al. | 438/261 |
| 6,166,428 | A * | 12/2000 | Mehta et al. | 257/636 |
| 6,617,639 | B1 | 9/2003 | Wang et al. | |
| 6,674,138 | B1 | 1/2004 | Halliyal et al. | |
| 6,949,455 | B2 | 9/2005 | Pham et al. | |
| 7,122,415 | B2 | 10/2006 | Jang et al. | |
| 7,202,524 | B2 * | 4/2007 | Kim et al. | 257/330 |
| 2004/0040501 | A1 * | 3/2004 | Vaartstra | 118/715 |
| 2004/0051134 | A1 * | 3/2004 | Jang et al. | 257/316 |
| 2005/0151166 | A1 * | 7/2005 | Lin et al. | 257/204 |
| 2006/0154420 | A1 * | 7/2006 | Choi | 438/264 |
| 2006/0261389 | A1 | 11/2006 | Vaartstra | |
| 2007/0018231 | A1 * | 1/2007 | Mitani et al. | 257/315 |
| 2007/0102754 | A1 * | 5/2007 | Chen et al. | 257/324 |

OTHER PUBLICATIONS

German Patent Office, German Office Action dated Feb. 28, 2014.

* cited by examiner

*Primary Examiner* — Lynne Gurley
*Assistant Examiner* — Vernon P Webb
(74) *Attorney, Agent, or Firm* — Slater Matsil, LLP (57) ABSTRACT

One or more embodiments are related to a semiconductor device, comprising: a high-K dielectric material; and a nitrogen-doped silicon material disposed over said high-k dielectric material.

26 Claims, 8 Drawing Sheets

SEMICONDUCTOR DEVICE AND METHOD OF MAKING SEMICONDUCTOR DEVICE

FIELD OF THE INVENTION

Generally, the present invention relates to semiconductor devices and methods of making semiconductor devices. More particularly, the present invention relates to the application of high-K dielectric materials to semiconductor technology.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically shored as a logical "1" or "0". Memory devices may be static or dynamic. Dynamic memory devices need to be refreshed to "remember" the data, whereas static memory devices do not need to be refreshed to retain stored data.

One type of static memory device, also referred to as a non-volatile memory (NVM) device, is a floating gate device. Floating gate memory devices can be either erasable programmable read-only memory (EPROM) or electrically erasable programmable read-only memory (EEPROM). Both of these floating gate memories rely on charge stored in the floating gate (or a charge trap layer) by suitable application of a bias to the various terminals of the device. The charge may be stored by a number of mechanisms such as carrier tunneling and/or injection. The charge may be removed either electrically as in EEPROM or by an external source such as an ultra violet light. The present of this charge in the floating gate determines the state of the memory "1" or "0". Flash EEPROM memories are so called due to their fast program and erase times (as in a lightning flash).

The floating gate devices may be stacked in large arrays to form memory cells such as a Flash memory cells. Based on the stacking or layout of the floating gate transistors, flash memories may comprise NOR, NAND or a AND memory architecture. As an example, most commercial memory cards such as memory sticks comprise NAND flash memory cells. Flash memories are amongst the most popular memories available in the market today. The popularity of flash memory arises partly due to its compatibility with existing CMOS process flows. Flash memory is simply a field effect transistor except it has a polysilicon floating gate (or silicon nitride charge trap layer) sandwiched between a tunnel oxide and an inter-poly oxide to form a charge storage layer.

SUMMARY OF THE INVENTION

An embodiment of the invention is a semiconductor device, comprising: a high-K dielectric material; and a silicon material disposed over the second dielectric material, the silicon material comprising the element nitrogen.

An embodiment of the invention is a semiconductor device, comprising: a substrate; a first dielectric disposed over the substrate; a floating gate disposed over the first dielectric; a second dielectric material disposed over the floating gate; a silicon material disposed over the second dielectric material, the silicon material comprising the element nitrogen; and a control gate disposed over the silicon material.

An embodiment of the invention is a semiconductor device, comprising: a substrate; a first dielectric layer disposed over the substrate; a first gate disposed over the first dielectric layer; a second dielectric layer disposed over the first gate; a silicon material disposed over the high-K material, the silicon material comprising the element nitrogen; and a second gate disposed over the silicon material.

An embodiment of the invention is a method of making a semiconductor device, comprising: providing a surface having a first portion and a second portion; forming a high-K dielectric material over the first portion; forming a silicon material over the high-K dielectric, the silicon material comprising the element nitrogen; and subjecting the silicon material and the second portion of the surface to a controlled thermal oxidation process.

An embodiment of the invention is a method of making a semiconductor device, comprising: providing a surface, the surface having a first portion and a second portion; forming a high-K dielectric material over the first portion; forming an additional material over the high-K dielectric material; and subjecting the additional material and the second portion to a dielectric formation process, the dielectric formation process causing an additional dielectric to be formed on the second portion, the additional material not allowing essentially any of the additional dielectric to be formed on the additional material. In one or more embodiment, the additional material may be a nitrogen-doped silicon material. In one or more embodiments the additional material may be a nitrogen-doped polysilicon material. In one or more embodiments, the additional material may be a nitrogen-doped amorphous silicon material.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

FIGS. 1 through 7 illustrate cross-sectional views of a partially completed semiconductor device or chip 100 at various stages of fabrication in accordance with some embodiments of the invention. The semiconductor device or chip 100 includes at least a first portion 100M and a second portion 100L. In the embodiment illustrated in FIGS. 1 through 7, the first portion 100M may be a memory portion of the semiconductor device or chip 100. The memory portion 100M may include a floating gate memory device. In the embodiment illustrated in FIGS. 1 through 7, the second portion 100L may be a logic portion of the semiconductor device or chip 100. The logic portion 100L may include a MOS transistor (such as an NMOS or PMOS transistor) that may be part of a logic gate or flip-flop. Hence, FIGS. 1 through 7 illustrate cross-sectional views of a partially completed semiconductor device 100 having a memory portion 100M and a logic portion 100L.

Figure 1:
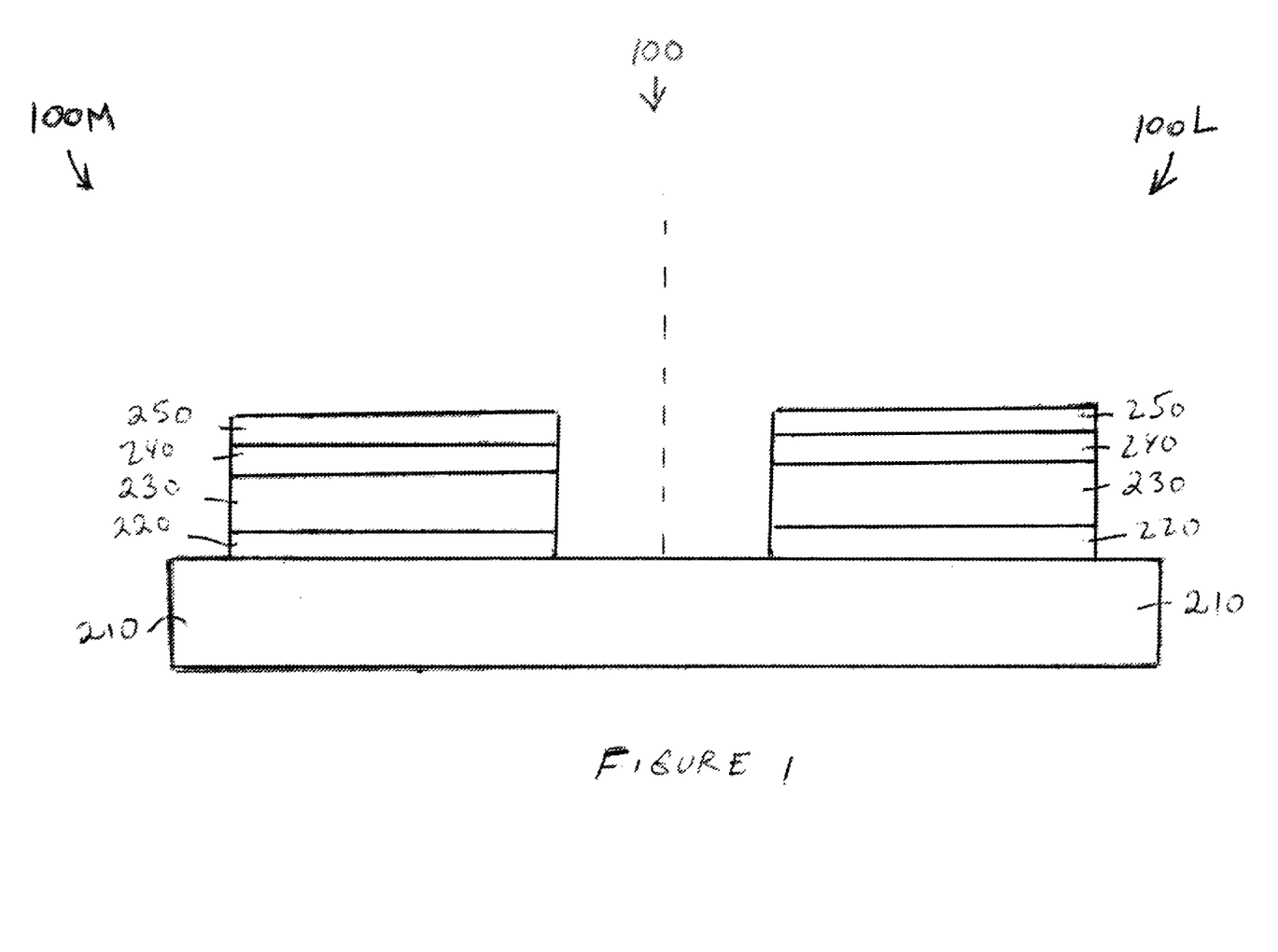
FIGS. 1 through 7 illustrate cross-sectional views of a partially completed semiconductor device or chip at various stages of fabrication in accordance with an embodiment of the present invention.

Referring to FIG. 1, a common semiconductor substrate 210 is provided for both the memory portion 100M and logic portion 100L of the structure. The substrate 210 may be any type of substrate. In an embodiment, the substrate 210 may be a p-type substrate. However, more generally, in one or more embodiments of the invention, the substrate may be a silicon substrate or other suitable substrate. The substrate may be a bulk mono-crystalline silicon substrate (or a layer grown thereon or otherwise formed therein), a layer of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

Next, a first dielectric material 220 is formed over the substrate 210 in both the memory portion 100M and the logic portion 100L. In one or more embodiments, the first dielectric layer 220 may comprise an oxide (such as silicon dioxide $SiO_2$), a nitride (such as $Si_3N_4$ or $Si_xN_y$) an oxynitride (for example, a nitrided oxide) such as $SiO_xN_y$, an oxide/nitride stack such as a $SiO_2/Si_xN_y$ stack (where the layers may be in any order), an oxide/nitride/oxide stack (for example, an ONO stack) or combinations thereof.

In one or more embodiments, the first dielectric material may comprise a high-K dielectric material. The high-K material may have a dielectric constant greater than 3.9. The high-K material may have a dielectric constant greater than silicon dioxide. The high-K material may comprise a hafnium-based material. The high-K material may comprise one or more of the elements Hf, Al, Si, Zr, O, N, Ta, La, Ti, Y, Pr, Gd and combinations thereof. The high-K material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-K material may comprise $Al_2O_3$. In one or more embodiments, the first dielectric material 220 may comprise any other dielectric material or high-k dielectric material. In one or more embodiments, the first dielectric material 220 may comprise an oxide/high-K stack such as a $SiO_2/Al_2O_3$ stack.

In one or more embodiments, the first dielectric material may have a thickness of at least 4 nm (nanometers). In one or more embodiments, the first dielectric material may have a thickness greater than about 6 nm. In one or more embodiments, the first dielectric material may have a thickness greater than about 8 nm. In one or more embodiment, the first dielectric material may have a thickness of less than about 15 nm. In one or more embodiments, the first dielectric material may have a thickness of less than about 12 nm. In one or more embodiments, the first dielectric material may comprise a single layer of material or it may comprise two or more layers of material.

The first dielectric material may be formed in many different ways. For example, the first dielectric material may be grown by a thermal oxidation, deposited by a chemical vapor deposition, atomic layer deposition, physical vapor deposition, or a jet vapor deposition.

In one or more embodiments, the first dielectric material may serve as the floating gate dielectric material for the floating gate of a floating gate memory device that is formed in the memory portion 100M of the chip. In one or more embodiments, the floating gate dielectric material may serve as a tunneling dielectric material for a floating gate memory device.

Next, a floating gate material 230 may be formed over the first dielectric material 220 for both the memory portion 100M and the logic portion 100L. In one or more embodiments, the floating gate material 230 may be any conductive material. Hence, in one or more embodiments, the material 230 may comprise any conductive material. In one or more embodiments, the floating gate material may comprise, for example, a polysilicon material. The polysilicon may be doped with an n-type dopant (such as phosphorus) or a p-type dopant (such a boron). The doping may be accomplished using an ion implantation process or it may be done in-situ.

In one or more embodiments, the floating gate material may comprise a metallic material such as a pure metal or a metal alloy. In one or more embodiments, the floating gate material 230 may be any material that can serve as a floating gate for a floating gate memory device. In one or more embodiments, the floating gate material 230 may comprise a conductive material. In one or more embodiments, the floating gate material 230 may comprise a semiconductor material. In one or more embodiments, it is possible that the floating gate material 230 may comprise a dielectric material.

In one or more embodiments, the floating gate material may comprise TiN, TiC, HfN, TaN, TaC, TaN, W, Al, Ru, RuTa, TaSiN, NiSix, CoSix, TiSix, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The floating gate material 230 may comprise a single layer or a plurality of stacked layers (such as a polysilicon layer disposed over a metal layer). In one or more embodiments, the thickness of the floating gate material 230 may be about 300 Angstroms to about 3000 Angstroms, however, other thicknesses are also possible. The floating gate material 230 may be deposited in many different ways. Examples, include chemical vapor deposition, physical vapor deposition and atomic layer deposition.

In one or more embodiments, the floating gate material 230 may serve as a floating gate material for the floating gate of a floating gate memory device.

Next, a second dielectric material 240 is disposed over the floating gate material for both the memory portion 100M and the logic portion 100L. In one or more embodiments, the second dielectric layer 240 may comprise an oxide (such as silicon dioxide $SiO_2$), a nitride (such as $Si_3N_4$ or $Si_xN_y$) an oxynitride (for example, a nitrided oxide) such as $SiO_xN_y$, an oxide/nitride stack such as a $SiO_2/Si_xN_y$ stack (where the layers may be in any order), an oxide/nitride/oxide stack (for example, an ONO stack) or combinations thereof.

In one or more embodiments, the second dielectric material may comprise a high-K dielectric material. The high-K material may have a dielectric constant greater than 3.9. The high-K material may have a dielectric constant greater than silicon dioxide. The high-K material may comprise a hafnium-based material. The high-K material may comprise one or more of the elements Hf, Al, Si, Zr, O, N, Ta, La, Ti, Y, Pr, Gd and combinations thereof. The high-K material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-K material may comprise $Al_2O_3$. Alternatively, the second dielectric material 240 may comprise any other dielectric material or high-k dielectric material.

In one or more embodiments, the second dielectric material 240 may have a thickness of at least 4 nm (nanometers). In one or more embodiments, the second dielectric material may have a thickness greater than about 6 nm. In one or more embodiments, the second dielectric material may have a thickness greater than about 8 nm. In one or more embodiment, the second dielectric material may have a thickness of less than about 20 nm. In one or more embodiments, the second dielectric material may have a thickness of less than about 12 nm. In one or more embodiments, the second dielectric material may comprise a single layer of material or it may comprise two or more layers of material.

The second dielectric material may be formed in many different ways. For example, the second dielectric material may be grown by a thermal oxidation, deposited by a chemical vapor deposition, atomic layer deposition, physical vapor deposition, or a jet vapor deposition.

In one or more embodiments, the second dielectric material may serve as an inter-gate dielectric material between a floating gate and a control gate of a floating gate memory device that is formed in the memory portion 100M of the chip. In one or more embodiments, the floating gate and the control gate may both be formed of a polysilicon material. In this case, the second dielectric material may be referred to as an inter-poly dielectric material.

It is noted that the use of a high-K material as an inter-gate dielectric material (or as an inter-poly dielectric material) in a floating gate memory device may be beneficial since the larger dielectric constant may lead to larger capacitive coupling. This may lead to a reduction in the power needed to operate the device.

Next, a silicon material 250 may be formed over the second dielectric material 240 in both the memory portion 100M and the logic portion 100L of the chip. In one or more embodiments, the silicon material 250 may be an amorphous silicon material. In one or more embodiments, the silicon material 250 may be a polysilicon material. In one or more embodiments, to form a polysilicon material, the silicon material 250 may first be deposited as an amorphous silicon material and then turned into a polysilicon material (e.g. a polycrystalline silicon material) by an annealing or thermal process.

In one embodiment, the silicon material 250 may have a thickness of less than about 30 nm. In one embodiment, the silicon material 250 may have a thickness of less than about 25 nm. In one embodiment, the silicon material 250 may have a thickness of less than about 20 nm. In another embodiment, the silicon material 250 may have a thickness of less than about 15 nm. In another embodiment, the silicon material 250 may have a thickness of less than about 10 nm. In another embodiment, the silicon material 250 may be around 7 nm or less. In one or more embodiments, the silicon material may have a thickness of about 5 nm or less. In one or more embodiments, the thickness of the silicon material may be about 5 nm or greater. In one or more embodiments, the thickness of the silicon material may be between about 5 nm and about 20 nm.

Figure 2:
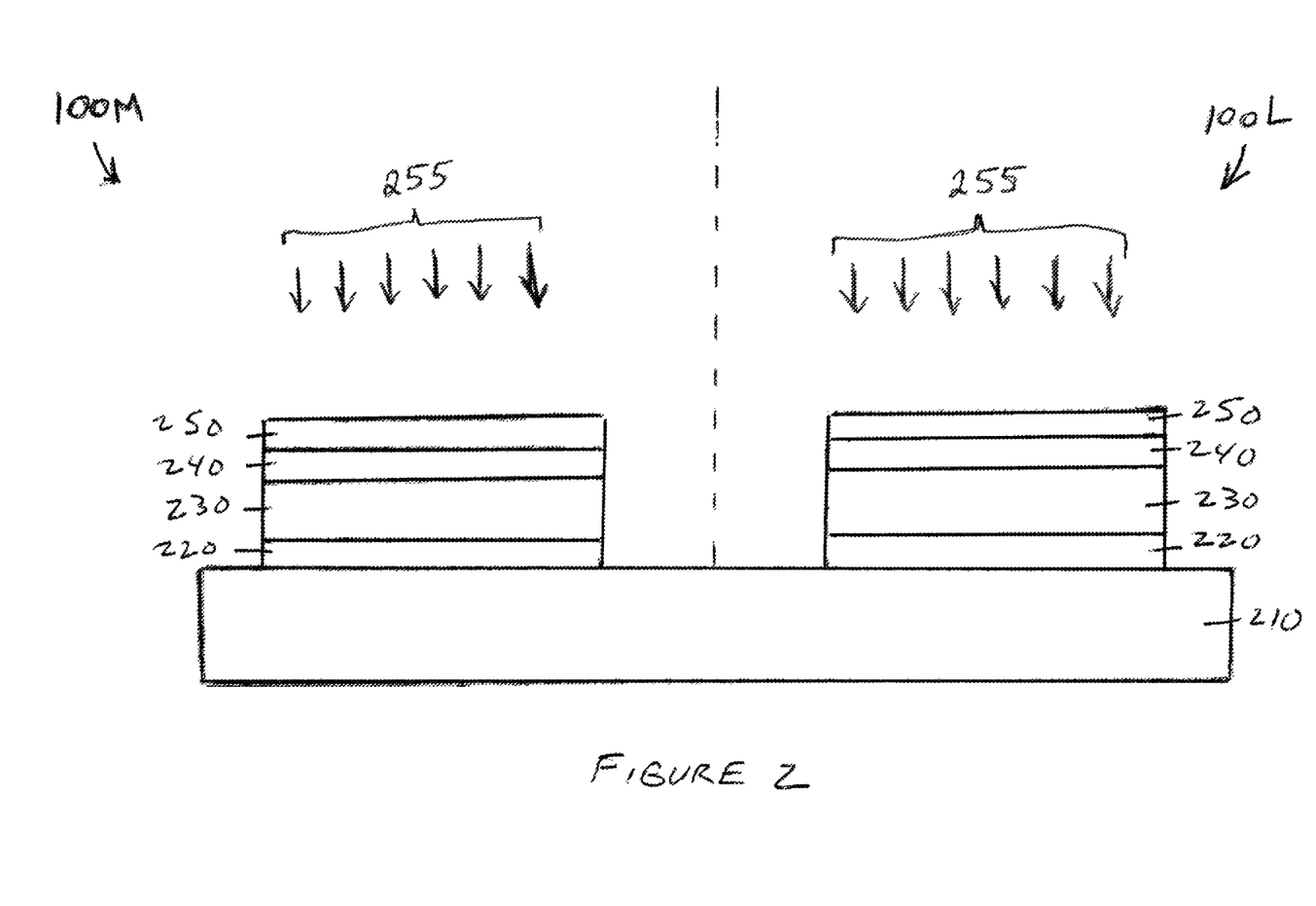

Referring to FIG. 2, the silicon material 250 may then be doped with the element nitrogen. This may be accomplished in many different ways and the present invention is not limited to any particular method of doping. In one or more embodiments, nitrogen doping may be accomplished by an ion implantation process. In one or more embodiments, nitrogen doping may be accomplished by some other means such as, for example, a gas phase process.

In one or more embodiments, the nitrogen doping may be accomplished by ion implanting the silicon material 250 with a nitrogen containing species. The ion implantation is shown as ion implantation 255 in FIG. 2. The actual species used in the ion implantation process is any species including the element nitrogen. In one or more embodiments, the dose of the ion implantation species may be about $10E14/cm^2$ or less. In one or more embodiments, the dose of the ion implantation species may be about $5E14/cm^2$ or less. In one or more embodiments, the dose of the ion implantation species may be about $1E14/cm^2$ or less. In one or more embodiments, the energy of the implant may be about 15 KeV or less. In one or more embodiments, the energy of the implant may be about 10 KeV or less. In one or more embodiments, the energy of the implant may be such that the nitrogen dopant enters the silicon material 250 but does not enter (or that essentially no nitrogen dopant enters) the second dielectric layer 240.

As a result of the ion implantation (or some other doping process), the silicon material 250 is thus doped with the element nitrogen (the element N) so that so as to form a silicon material comprising the element nitrogen. In the embodiment shown in FIG. 2, both the memory portion 100M and logic portion 100L of the chip is doped with the nitrogen. Alternately, the doping may be limited to the memory portion 100M of the chip. In one or more embodiments, the energy of the nitrogen implant may be such that the nitrogen atoms enter the silicon layer 250 but do not enter the second dielectric material 240 that is below it. The nitrogen doping of the silicon material 250 shown in FIG. 2 results in the nitrogen doped silicon material 250' shown in FIG. 3. In one or more embodiments, the nitrogen-doped silicon material 250' may be a nitrogen-doped amorphous silicon material. In one or more embodiments, the nitrogen-doped silicon material 250' may be a nitrogen-doped polysilicon material.

Figure 3:
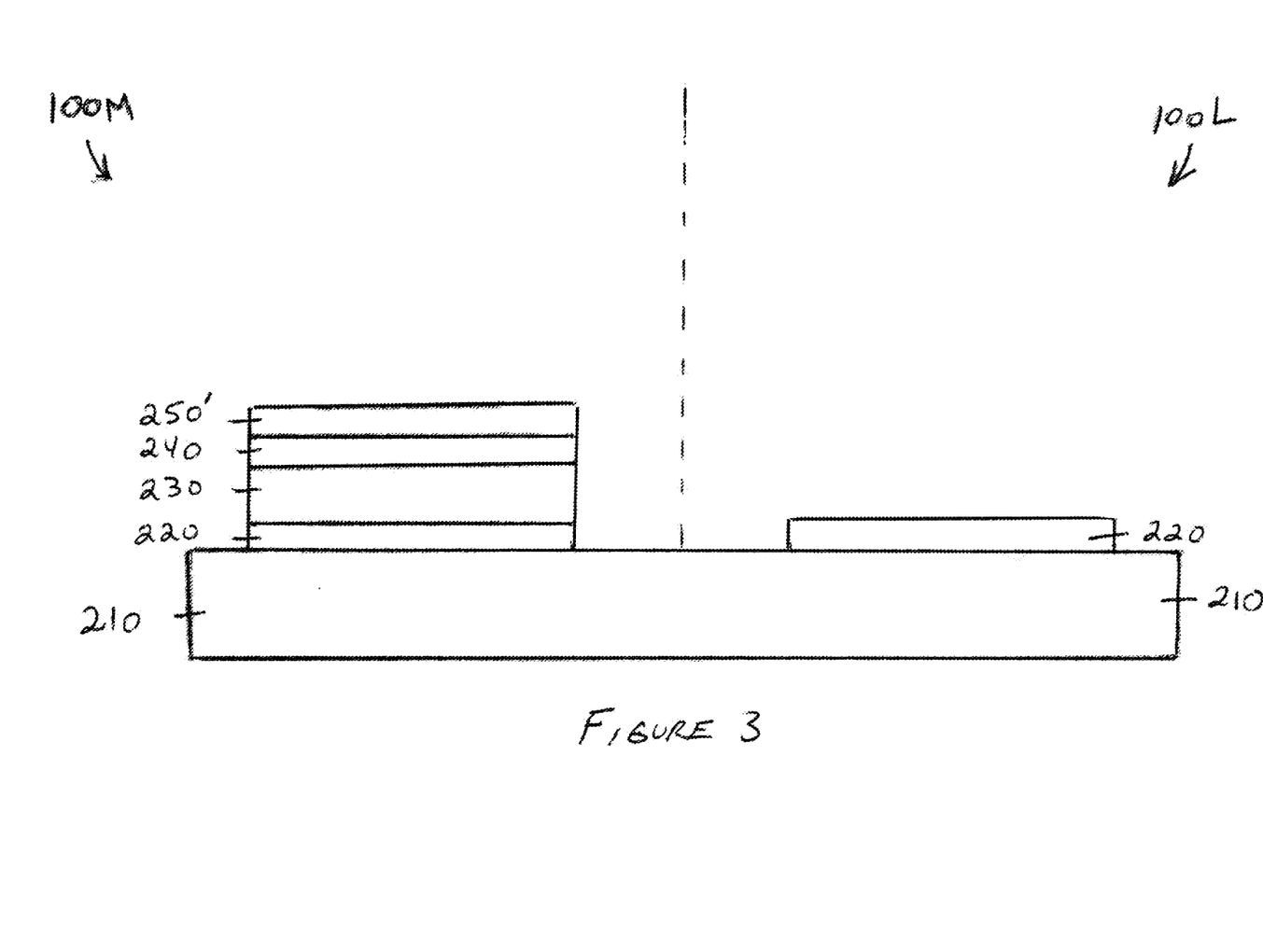

Next, referring to FIG. 3, the nitrogen-doped silicon material 250', the second dielectric material 240 and the first electrode material 230 may then be removed from the logic portion 100L of the chip. The removal may be accomplished through an etching process. The first dielectric material 220 remains on the logic portion 100L of the chip. It may serve as a screening layer for subsequent well implants. The nitrogen-doped silicon material 250', the second dielectric material 240, the floating gate material 230 and the first dielectric material 220 remain on the memory portion 100M.

Figure 4:
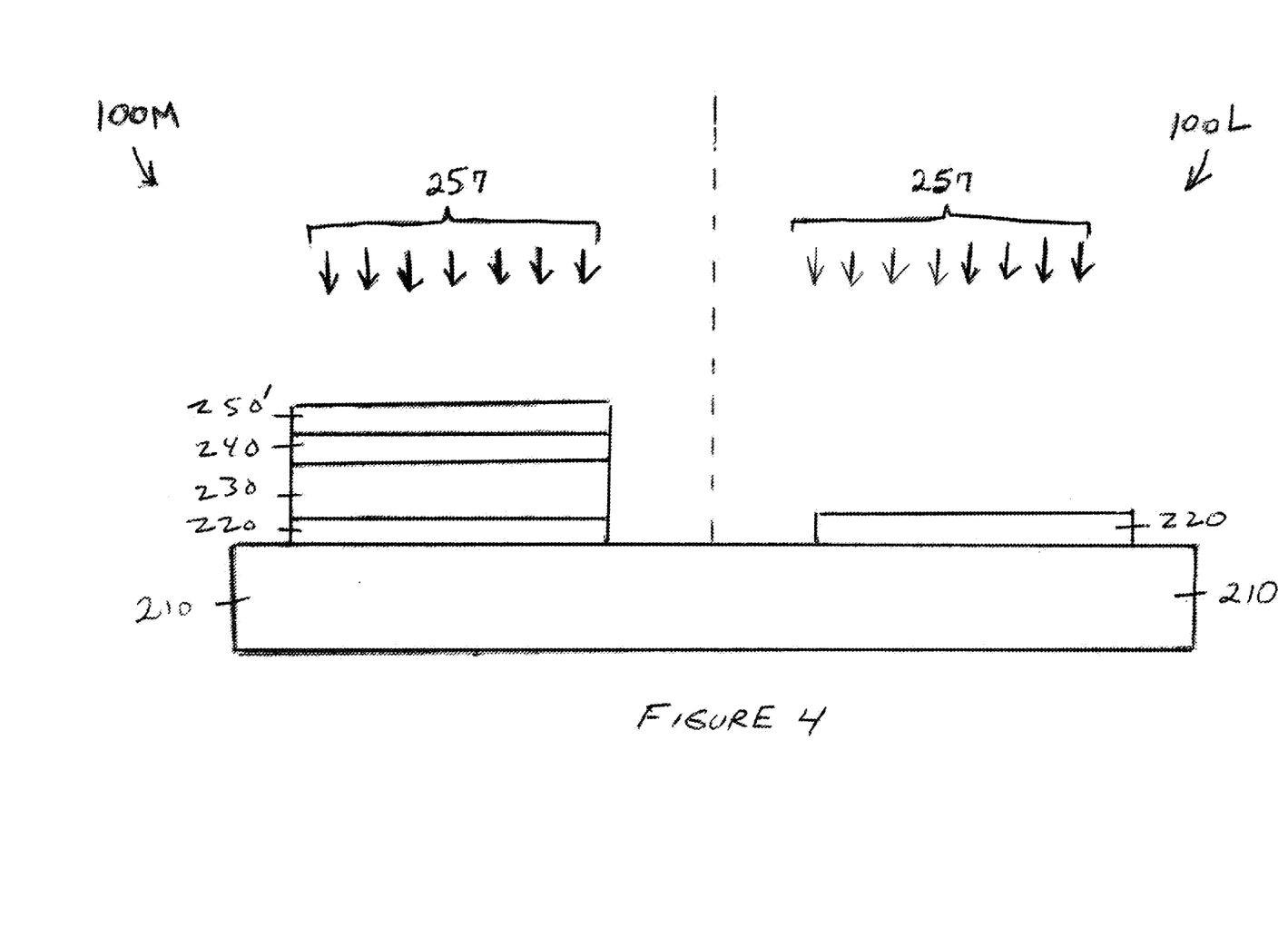

Referring to FIG. 4, both the memory portion 100M and logic portion 100L may be ion implanted with a p-type dopant and/or an n-type dopant. In FIG. 4, the dopant is shown as dopant 257. In the memory portion 100M of the chip, the stack of materials 220, 230, 240 and 250' prevents the dopant from reaching the substrate 210. However, in the logic portion 100L of the chip, the n-type or p-type dopants penetrate the first dielectric material 220 and enter the substrate 210. In the logic portion 100L, the n-type or n-type dopants may serve as well implants for the development of, for example, a MOS transistor. In addition, in the logic portion 100L, the first dielectric material 220 may serve as a screening layer (for example, as a screening oxide, if the first dielectric material is an oxide) for the well implants for the logic portion 100L.

Figure 5:
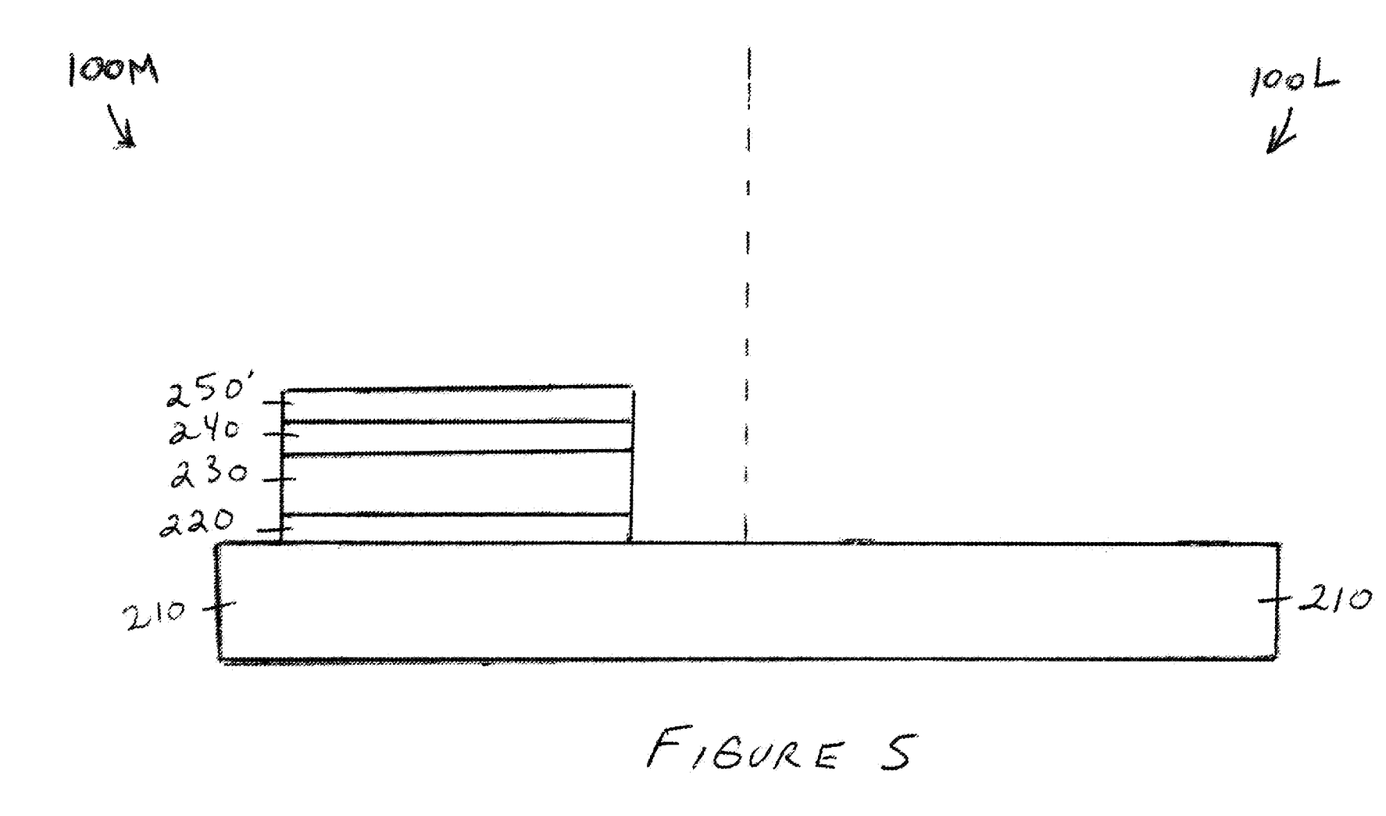

Referring to FIG. 5, the first dielectric material 220 is removed from the logic portion 100L. After the dielectric layer 220 is selectively removed from the logic portion 100L, the memory portion 100M and the logic portion 100L of the structure shown in FIG. 5 is subjected to a thermal oxidation process. The thermal oxidation process may be a dry or a wet oxidation. An example of a dry oxidation is a chemical reaction between silicon and a dry oxygen (e.g. no moisture). This may be achieved through a plasma oxidation process. An example of a wet oxidation is a chemical reaction between silicon and an oxygen saturated with water vapor.

Figure 6:
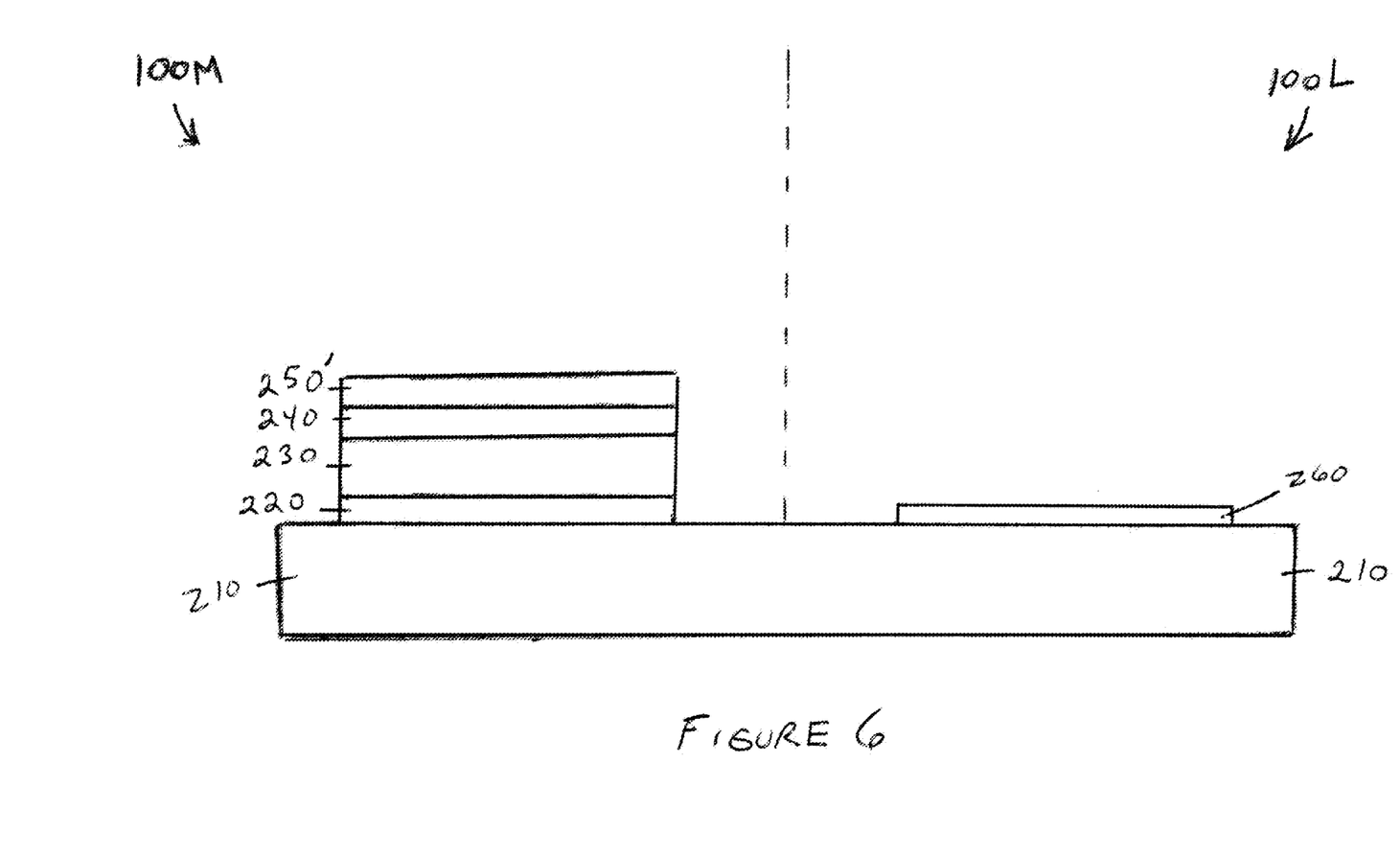

FIG. 6 shows the result of the thermal oxidation. The thermal oxidation process forms a thermally grown oxide layer 260 on the substrate 210 in the logic portion 100L. The oxide layer 260 may be formed of a silicon dioxide material. However, essentially no oxide or very little oxide (e.g. a negligible oxide) is formed on the nitrogen doped silicon material 250' in the memory portion 100M.

In one or more embodiments, it is possible that the nitrogen-doped silicon material 250' be replaced with some other material that will not permit the growth of an oxide on its surface.

In one or more embodiments, it is possible that the oxide layer 260 be replaced with another dielectric material 260. In one or more embodiments, it is possible that the oxide layer 260 be replaced with another dielectric material 260 that can serve as a gate dielectric for a gate stack of a MOS transistor. The dielectric material 260 may, for example, comprise a nitride. The dielectric material 260 may comprise an oxynitride. The dielectric material 260 may be formed as a stack of two or more materials. The dielectric material 260 may comprise a high-K material. In one or more embodiments, the dielectric material 260 may be formed by a growth process. In one or more embodiments, the dielectric material 260 may be formed from a growth process.

In addition, it is possible that the nitrogen-doped silicon material 250' be replaced with some other material than will prevent the formation (for example, growth or deposition) of a dielectric material 260.

Figure 7:
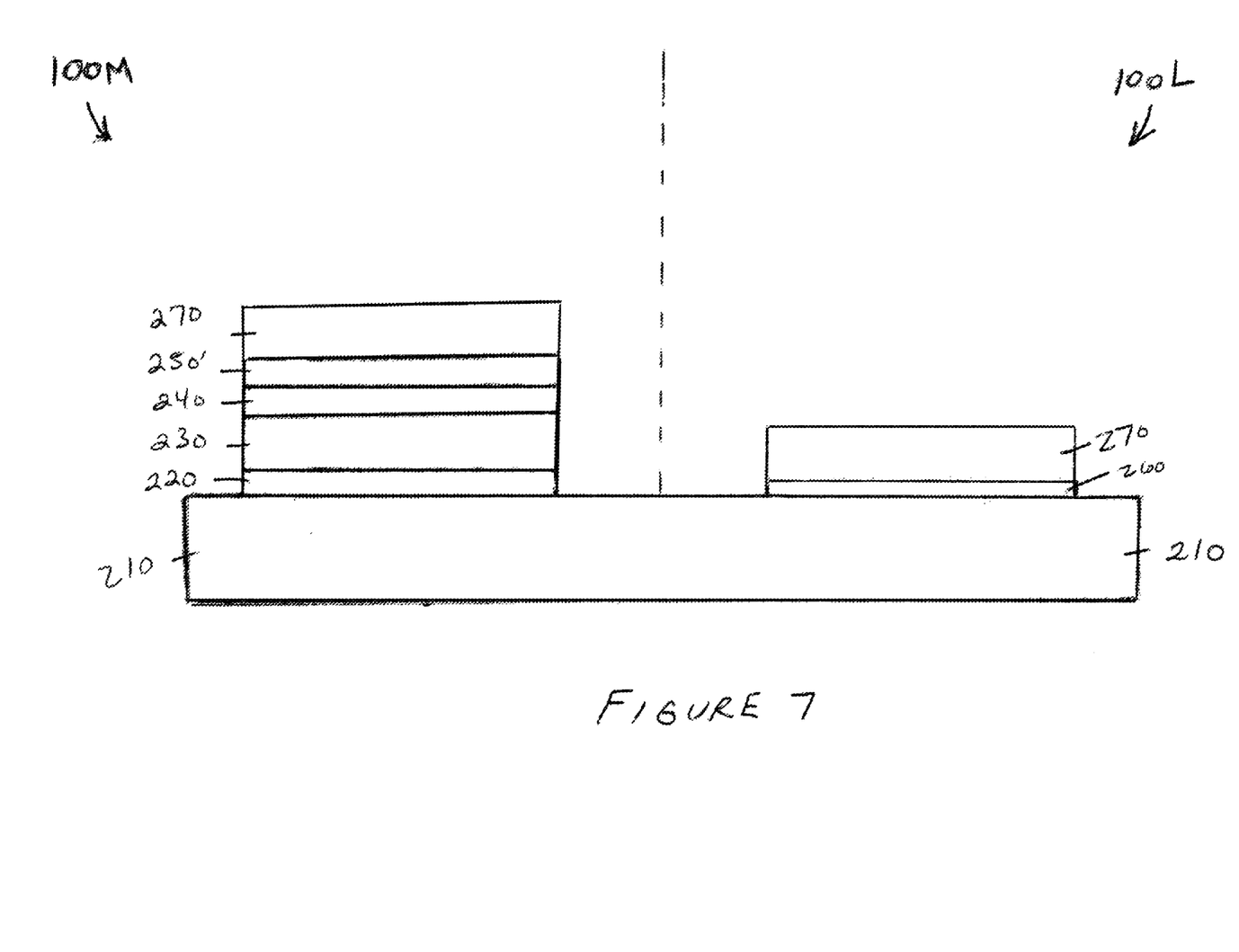

Next, referring to FIG. 7, a control gate material material 270 is formed over the memory portion 100M and logic portion 100L of the structure from FIG. 6. In one or more embodiments, the control gate material 270 may be any conductive material. Hence, in one or more embodiments, the material 270 may comprise any conductive material. In one or more embodiments, the control gate material 270 may comprise, for example, a polysilicon material. The polysilicon may be doped with an n-type dopant (such as phosphorus) or a p-type dopant (such a boron). The doping may be accomplished using an ion implantation process or be done in-situ.

In one or more embodiments, the control gate material 270 may comprise a metallic material such as a pure metal or a metal alloy. In one or more embodiments, the control gate material may be any other material suitable as a control gate for a floating gate device. In one or more embodiments, the control gate material 270 may comprise TiN, TiC, HfN, TaN, TaC, TaN, W, Al, Ru, RuTa, TaSiN, NiSix, CoSix, TiSi$_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The control gate material 270 may comprise a single layer or a plurality of stacked layers (such as a polysilicon layer disposed over a metal layer). In one or more embodiments, the thickness of the control gate material 230 may be about 300 Angstroms to about 3000 Angstroms, however, other thicknesses are also possible. The control gate material 270 may be deposited in many different ways. Examples, include chemical vapor deposition, physical vapor deposition and atomic layer deposition.

In one or more embodiments, the control gate material 270 may serve as a control gate material for the control gate of a floating gate memory device that may be formed in the memory portion 100M. The control gate material 270 may also be used for the control gate of a transistor (such as an NMOS or PMOS transistor) that may be formed in the logic portion 100L.

Figure 8:
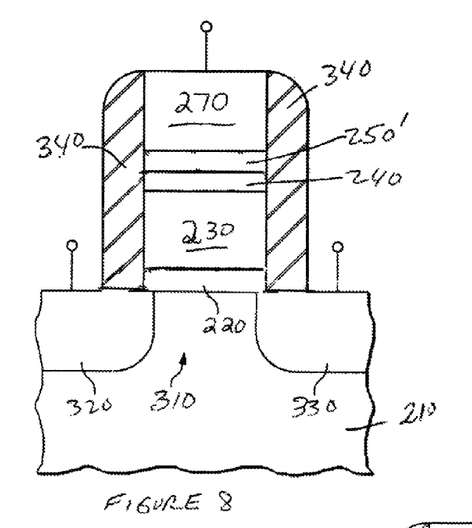
FIG. 8 shows an embodiment of a floating gate memory device.

FIG. 8 shows an embodiment of a floating gate memory device that may be formed on the memory portion of the semiconductor chip. FIG. 8 shows the substrate 210. A channel 310, a source 320 and a drain 330 are disposed in the substrate 210. The first dielectric material 220, the floating gate material 230, the second dielectric material 240 and the control gate material 240 that are shown in FIG. 7 have all been appropriate etched to form a gate dielectric layer 220, a floating gate 230, a inter-gate dielectric layer 240, a nitrogen doped silicon layer 250' and a control gate 270. In one or more embodiments, the floating gate 230 as well as the control gate 270 may each comprise a polysilicon material (but not necessarily the same polysilicon material). The polysilicon may be an n-doped or p-doped polysilicon material. In such a case, the inter-gate dielectric layer 240 may be referred to as an inter-poly dielectric layer.

FIG. 8 shows a spacer 340 covers the exposed side portions of the floating gate 230 and control gate 270 and helps to prevent accidental shorting of the floating gate 230 with the control gate 270. The spacer 340 may be formed of a dielectric material. In one or more embodiments, the source and the drain may both be n-type doped. In one or more embodiments, the source and drain may both be p-type doped. In one or more embodiments, the substrate 210 may be formed of a p-type silicon, the source 320 may be an n-type silicon (such as n+ type), the drain 330 may be an n-type silicon (such as n+ type), the control gate may be formed of an n-type polysilicon and the control gate may be formed of an n-type polysilicon.

Figure 9:
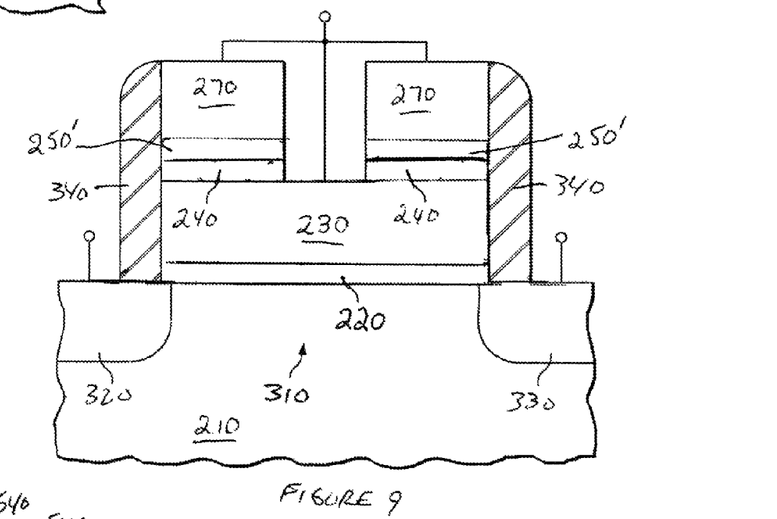
FIG. 9 shows an embodiment of a high voltage transistor.

In another embodiment of the invention, it is also possible, in another embodiment of the invention, that another type of device be formed in the memory portion of the semiconductor chip using the method described herein. FIG. 9, shows an embodiment of a high voltage transistor that may be formed in the memory portion of the semiconductor chip. FIG. 9 shows a channel region 310, a source region 320 and a drain region 330 disposed in the substrate 210. The first dielectric material 220, the floating gate material 230, the second dielectric material 240, the nitrogen doped silicon material 250' and the control gate material 270 that are shown in FIG. 7 have all been appropriate etched to form a gate dielectric layer 220, a first gate 230, an inter-gate dielectric layer 240, a nitrogen doped silicon layer 250' and a second gate 270. In the embodiment shown, the first gate 230 and the second gate 270 are electrically coupled together. In one or more embodiments, the first gate 230 as well as the second gate 270 may each comprise a polysilicon material. In one or more embodiments, the gates 230, 270 may comprise the same polysilicon material. In such a case, the inter-gate dielectric layer 240 may be referred to as an inter-poly dielectric layer. In one or more embodiments, the gates 230, 270 may comprise different polysilicon materials. In one or more embodiments, the substrate 210 may be formed of a p-type silicon, the source region 320 may be an n-type silicon (such as n+ type), the drain region 330 may be an n-type silicon (such as n+ type), the first gate 230 may be formed of an n-type polysilicon and the second gate 270 may be formed of an n-type polysilicon.

FIG. 9 shows a spacer 340 that covers the sidewall surfaces of the first gate 230 and the second gate 270. The spacer 340 may be formed of a dielectric material. In one or more embodiments, the source and the drain may both be n-type doped. In one or more embodiments, the source and drain may both be p-type doped.

Figure 10:
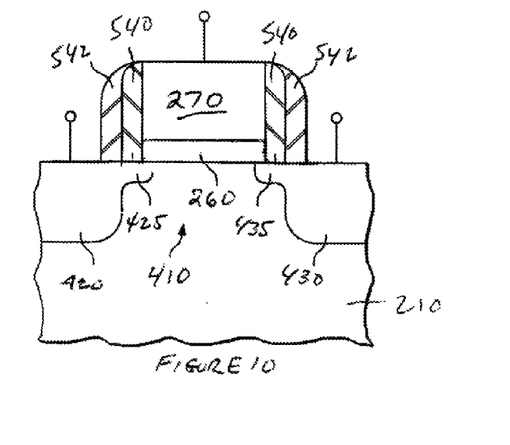
FIG. 10 shows an embodiment of a transistor.

FIG. 10 shows an embodiment of a MOS device that may be formed on the logic portion of the chip as a result of the process described herein. The device may be a MOS transistor such as an NMOS transistor or a PMOS transistor. FIG. 10 shows the substrate 210. A channel 410, a source 420, a source extension 425, a drain 430, and a drain extension 435 disposed in the substrate 210. The gate oxide material 260 and the control gate material 270 shown in FIG. 7 have all been appropriate etched to form a gate oxide layer 260 and the control gate 270. The gate oxide layer 260 and the control gate 270 may be referred to as the gate stack of the MOS device.

Referring to FIG. 10, in one or more embodiments, the gate oxide layer 260 may be replaced with another dielectric material 260 that may be used for a gate dielectric. Hence, in one or more embodiments, gate dielectric layer 260 may be any dielectric such as a oxide, nitride, or oxynitride. In one or more embodiments, the dielectric layer 260 may also comprise a high-K material. Spacers 540, 542 cover the sidewalls of the gate dielectric layer 260 and the control gate 270. In one or more embodiments, spacers 540, 542 may be formed of a dielectric material. In one or more embodiments, the source and drain 420, 430 may be n-type doped while the extensions 425, 435 may be more lightly n-type doped. In one or more embodiments, the source and drain 420, 430 may be p-type doped while the extensions 425, 435 may be more lightly p-type doped.

What is claimed is:

1. A semiconductor memory device, comprising:
   a semiconductor substrate;
   a first dielectric layer disposed over said semiconductor substrate;
   a first conductive layer disposed over said first dielectric layer;
   a high-k dielectric layer disposed over said first conductive layer;
   a nitrogen-doped silicon material disposed over and in direct contact with said high-k dielectric layer, wherein the high-k dielectric layer and the nitrogen-doped silicon material comprise different compositions; and
   a second conductive layer disposed over and in direct contact with said nitrogen-doped silicon material, wherein the high-k dielectric layer and the nitrogen-doped silicon material are disposed between the first conductive layer and the second conductive layer.

2. The device of claim 1, wherein said first dielectric layer comprises an oxide.

3. The device of claim 1, wherein said first conductive layer comprises polysilicon.

4. The device of claim 1, wherein said nitrogen-doped silicon material is n-type doped or p-type doped.

5. The device of claim 1, wherein the nitrogen-doped silicon material has a thickness of less than about 20 nm.

6. The device of claim 1, wherein said second conductive layer comprises polysilicon.

7. A semiconductor memory device, comprising:
   a semiconductor substrate;
   a first dielectric layer disposed over said semiconductor substrate;
   a floating gate material disposed over said first dielectric layer;
   a high-k dielectric layer disposed over and in direct contact with said floating gate material;
   a nitrogen-doped silicon material disposed over and in direct contact with said high-k dielectric layer, wherein the high-k dielectric layer and the nitrogen-doped silicon material comprise different compositions; and
   a control gate material disposed over and in direct contact with said nitrogen-doped silicon material.

8. The device of claim 7, wherein said first dielectric layer comprises an oxide.

9. The device of claim 7, wherein said floating gate material comprises a conductive material.

10. The device of claim 9, wherein said conductive material comprises polysilicon.

11. The device of claim 7, wherein said nitrogen-doped silicon material is n-type doped or p-type doped.

12. The device of claim 7, wherein nitrogen-doped silicon material includes a nitrogen-doping from a dose of $10E14/cm^2$ or less.

13. The device of claim 7, wherein the nitrogen-doped silicon material of less than about 20 nm.

14. The device of claim 7, wherein said control gate material comprises a conductive material.

15. The device claim 14, wherein said conductive material comprises polysilicon.

16. The device of claim 7, wherein said high-K dielectric layer includes one or more of the elements Hf, Al, Zr, Ta, La, Ti, Y, Pr, or Gd.

17. The device of claim 7, wherein said high-K dielectric layer includes one or more of the materials HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, or $ZrSiAlO_xN_y$.

18. The device of claim 1, wherein nitrogen-doped silicon material includes a nitrogen-doping from a dose of $10E14/cm^2$ or less.

19. The device of claim 1, wherein said high-K dielectric layer includes one or more of the elements Hf, Al, Zr, Ta, L, Ti, Y, Pr, or Gd.

20. The device of claim 1, wherein said high-K dielectric layer includes one or more of the material HfSiON, HfSio, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, or $ZrSiAlO_xN_y$.

21. A semiconductor device comprising:
   a semiconductor substrate comprising a first region comprising a memory device and a second region comprising a logic device;
   wherein the memory device comprises:
      a first dielectric layer disposed over said first region of said semiconductor substrate;
      a first conductive layer disposed over said first dielectric layer;
      a high-k dielectric layer disposed over said first conductive layer;
      a nitrogen-doped silicon material disposed over and in direct contact with said high-k dielectric layer, wherein the high-k dielectric layer and the nitrogen-doped silicon material comprise different compositions;
      a second conductive layer comprising a first portion and a second portion, wherein the first portion of the second conductive layer is disposed over and in direct contact with said nitrogen-doped silicon material, wherein the high-k dielectric layer and the nitrogen-doped silicon material are disposed between the first conductive layer and the second conductive layer; and
   wherein the logic device comprises:
      a gate oxide layer disposed over said second region of said semiconductor substrate;
      wherein the second portion of the second conductive layer is disposed over the gate oxide layer.

22. The device of claim 21, further comprising:
a first spacer disposed on sidewalls of the first dielectric layer, the first conductive layer, the high-k dielectric layer, the nitrogen-doped silicon material, and the first portion of the second conductive layer.

23. The device of claim 22, further comprising:
a second spacer disposed on sidewalls of the gate oxide layer and the second portion of the second conductive layer; and
a third spacer disposed over the second spacer.

24. A semiconductor device comprising:
a semiconductor substrate;
a first dielectric layer disposed over said semiconductor substrate;
a first conductive layer disposed over said first dielectric layer;
a high-k dielectric layer disposed over said first conductive layer, the high-k dielectric layer having a first portion and a second portion separated from the first portion by a opening;
a nitrogen-doped silicon material disposed over and in direct contact with said high-k dielectric layer, wherein the high-k dielectric layer and the nitrogen-doped silicon material comprise different compositions, wherein the nitrogen-doped silicon material comprises a first portion and a second portion separated from the first portion of the nitrogen-doped silicon material by the opening; and
a second conductive layer disposed over and in direct contact with said nitrogen-doped silicon material, wherein the high-k dielectric layer and the nitrogen-doped silicon material are disposed between the first conductive layer and the second conductive layer; wherein the second conductive layer comprises a first portion and a second portion separated from the first portion of the second conductive layer by the opening.

25. The device of claim 24, wherein the first conductive layer is electrically coupled to the second conductive layer through the opening.

26. The device of claim 24, further comprising:
a spacer disposed on outward facing sidewalls of the first dielectric layer, the first conductive layer, the high-k dielectric layer, the nitrogen-doped silicon material, and the first portion of the second conductive layer.

* * * * *